United States Patent
Bajaj et al.

(10) Patent No.: US 8,717,202 B1
(45) Date of Patent: May 6, 2014

(54) FORCE SENSITIVE INPUT DEVICES AND METHODS

(71) Applicant: Aimpad, LLC, Noblesville, IN (US)

(72) Inventors: Nikhil Bajaj, West Lafayette, IN (US);
Lance William Madsen, Lafayette, IN (US)

(73) Assignee: Aimpad, LLC, Noblesville, IN (US)

( * ) Notice: Subject to any disclaimer, the term of this patent is extended or adjusted under 35 U.S.C. 154(b) by 0 days.

(21) Appl. No.: 13/804,779

(22) Filed: Mar. 14, 2013

(51) Int. Cl.
    *H03M 11/00* (2006.01)
(52) U.S. Cl.
    USPC ............ 341/31; 341/20; 341/34; 250/227.21; 250/227.11; 84/615; 84/462
(58) Field of Classification Search
    USPC ........ 341/20–22, 31, 34; 250/227.21, 227.11; 84/615, 462
    See application file for complete search history.

(56) References Cited

U.S. PATENT DOCUMENTS

| | | | |
|---|---|---|---|
| 2,919,350 A | | 12/1959 | Taylor et al. |
| 3,356,848 A | | 12/1967 | Heyck |
| 4,130,941 A | | 12/1978 | Amsbury |
| 4,311,990 A | * | 1/1982 | Burke ............................. 341/31 |
| 4,534,668 A | * | 8/1985 | Hildel et al. .................. 400/477 |
| 4,541,059 A | | 9/1985 | Toshihiko |
| 4,591,712 A | * | 5/1986 | Thalmann ................ 250/227.21 |
| 4,670,653 A | | 6/1987 | McConkle et al. |
| 4,766,306 A | * | 8/1988 | Bichsel et al. ........... 250/227.21 |
| 4,812,635 A | | 3/1989 | Kaufmann et al. |
| 4,836,636 A | * | 6/1989 | Obara et al. .................... 385/19 |
| 4,980,685 A | * | 12/1990 | Souloumiac et al. ........... 341/31 |
| 5,311,014 A | | 5/1994 | Liucci |
| 5,355,148 A | | 10/1994 | Anderson |
| 5,434,566 A | | 7/1995 | Iwasa et al. |
| 5,499,041 A | | 3/1996 | Brandenburg et al. |
| 5,943,233 A | | 8/1999 | Ebina et al. |
| 6,195,082 B1 | * | 2/2001 | May et al. ...................... 345/161 |
| 6,229,081 B1 | * | 5/2001 | Ura et al. ........................ 84/462 |
| 6,507,433 B2 | | 1/2003 | Mecham et al. |
| 6,612,160 B2 | | 9/2003 | Massie et al. |
| 6,684,166 B2 | | 1/2004 | Bellwood et al. |

(Continued)

FOREIGN PATENT DOCUMENTS

JP 5303466 A 11/1993
WO 2005055028 A2 6/2005

OTHER PUBLICATIONS

McPherson et al., "Augmenting the Acoustic Piano with Electromagnetic String Actuation and Continuous Key Position Sensing," Proceedings of the 2010 Conference on New Interfaces for Musical Expression, Jun. 2010, pp. 217-222, Sydney, Australia.
Cherry Corp., "Keymodule MX," Dec. 7, 2006, pp. 62-63.

(Continued)

*Primary Examiner* — Albert Wong
(74) *Attorney, Agent, or Firm* — Barnes & Thornburg LLP

(57) ABSTRACT

Illustrative embodiments of force sensitive input devices and methods are disclosed. In at least one embodiment, a force sensitive input device may comprise a button movable along a first axis between a first end position and a second end position, the button including a reflective surface, a resilient component biasing the button toward the first end position, and a reflectance sensor configured to emit light that impinges upon the reflective surface and to measure an amount of the light that is reflected from the reflective surface, wherein the light travels generally parallel to the first axis.

29 Claims, 5 Drawing Sheets

(56) References Cited

U.S. PATENT DOCUMENTS

| | | |
|---|---|---|
| 6,697,501 B2 | 2/2004 | Tevs et al. |
| 6,875,977 B2 * | 4/2005 | Wolter et al. ............. 250/221 |
| 7,116,430 B2 | 10/2006 | Degertekin et al. |
| 7,417,624 B2 | 8/2008 | Duff |
| 7,518,737 B2 | 4/2009 | Hall et al. |
| 7,528,824 B2 | 5/2009 | Kong |
| 8,102,554 B2 | 1/2012 | Silverbrook et al. |
| 8,242,388 B2 | 8/2012 | Song |
| 8,350,143 B2 * | 1/2013 | Fujiwara et al. ............. 84/615 |
| 2001/0007449 A1 | 7/2001 | Kobachi et al. |
| 2003/0052257 A1 * | 3/2003 | Sumriddetchkajorn . 250/227.11 |
| 2003/0102422 A1 | 6/2003 | Gombert |
| 2009/0032313 A1 | 2/2009 | Silverbrook et al. |
| 2009/0046065 A1 | 2/2009 | Liu et al. |
| 2010/0062583 A1 * | 3/2010 | Hanaoka et al. ............. 438/458 |
| 2010/0148999 A1 | 6/2010 | Casparian et al. |
| 2010/0286947 A1 | 11/2010 | Chiang et al. |
| 2010/0321670 A1 | 12/2010 | Kuo |
| 2011/0025606 A1 | 2/2011 | Chvojcsek et al. |
| 2011/0269543 A1 | 11/2011 | Johnson |

OTHER PUBLICATIONS

Fairchild Semiconductor Corp., "QRE1113, QRE1113GR Minature Reflective Object Sensor," Aug. 2011, pp. 1-8.

ATMEL Corp., "8-Bit AVR Microcontroller with 16/32K Bytes of ISP Flash and USB Controller," 2010, pp. 1-26.

Heckendorn, "Xbox Controller Mods: Analog WASD Gaming Keyboard," available at http://www.youtube.com/watch?v=gEwDImE0DU4, Nov. 25, 2012 (screenshot submitted).

* cited by examiner

FORCE SENSITIVE INPUT DEVICES AND METHODS

TECHNICAL FIELD

The present disclosure relates, generally, to input devices and methods and, more particularly, to force sensitive input devices and methods.

BACKGROUND

One common input device used in interfacing with a computing device is the digital switch or button. Digital switches typically include a physical electrical contact designed to present a low electrical resistance when the switch is activated and an open circuit when the switch is not activated. Such switches generally have a binary output (i.e., on or off, high or low). Many types of physical mechanisms, with different behaviors, may be used for digital switches. For example, rocker switches, toggle switches, tactile switches, and sliding switches are all examples of switches that take discrete on or off values. Some digital switches can represent more than two values (e.g., via multiple positions) by connecting some combination of three or more contacts. However, all of such switches have the significant limitation of only being able to take a discrete number of positions and, thus, only being able to represent a limited set of possible user intents.

Analog sensors may also be used in interfacing with a computing device to achieve more granularity along a continuum of user intent. As analog sensors typically measure a physical behavior or phenomenon that can vary continuously under the control of the user, they generally have a continuous range of output values. One example of an analog sensor is a potentiometer (i.e., variable resistor) coupled to a slider or knob that is manipulated by a user. The user may adjust the slider or knob to set the resistance of the potentiometer along a continuum of values, and this resistance may be measured by an appropriate circuit. Prior analog sensors, such as those based on variable resistors, have suffered from poor response time due to the measurement methods used and/or the relaxation time required by the materials utilized. Prior analog sensors have also provided poor tactile, or haptic, response that does not feed back the performance of the sensor to the user or provide reassurance that the input would be what the user expected.

When used in an input device, a sensor must fit into the form factor needed for the particular application. One common form factor used for interfacing with a computing device is the keyswitch (or "key"), which has been used in personal computer keyboards, gaming controllers, control panels of computer-numerically controlled (CNC) industrial equipment (e.g., lathes, saws, milling machines, and the like), and other computing devices. The key typically includes a resilient component (e.g., a metal coil spring, a rubber dome, etc.) that returns a keycap to a home state when a user is not interacting with the key. For many analog sensors, the incorporation of the additional circuitry used to measure the subject physical behavior or phenomenon into the form factor of a standard key is impractical. For instance, in an analog sensor utilizing a potentiometer (as described above), the potentiometer may not fit within the form factor of a standard key.

Gaming controllers used as input devices are often used to control the movement and/or actions of a character in an electronic game (e.g., a computer game). Gaming controllers typically include a number of digital switches or buttons. As described above, the digital buttons of such gaming controllers typically have a binary output that results in a character either moving at a constant speed or not moving at all. While controlling a character using four digital buttons (e.g., up, down, left, and right buttons) may result in a precise direction of movement, the magnitude or speed of movement is fixed. Some gaming controllers also include an analog joystick to allow more granular control of character movement and/or actions. Typically, analog sensors in the gaming controller determine how far the joystick is displaced from a center position along both an x-axis and a y-axis (simultaneously). Thus, in contrast to digital buttons, an analog joystick is able to control character movement in any direction (i.e., 360 degrees) and at different magnitudes (based on how far the joystick is moved from the center position). Unlike digital buttons, however, a user is not able to precisely control the direction of character movement (e.g., at exactly 90 degrees) with an analog joystick.

SUMMARY

The present invention comprises one or more of the features recited in the appended claims and/or the following features which, alone or in any combination, may comprise patentable subject matter:

According to one aspect, a force sensitive input device may comprise a button movable along a first axis between a first end position and a second end position, the button including a reflective surface, a resilient component biasing the button toward the first end position, and a reflectance sensor configured to emit light that impinges upon the reflective surface and to measure an amount of the light that is reflected from the reflective surface, wherein the light travels generally parallel to the first axis.

In some embodiments, the button may be positionable at an infinite number of positions between the first and second end positions. The button may comprise a keycap configured to be pressed by a user to move the button along the first axis toward the second end position, and a plunger supporting the keycap, the plunger engaging the resilient component. The resilient component may be a spring coupled to the plunger. The reflective surface may be a surface of the keycap, may be coupled to the keycap, may be a surface of the plunger, or may be coupled to the plunger.

In some embodiments, the reflective surface may be configured to move along a second axis that is parallel to the first axis. The reflective surface may be generally perpendicular to the second axis. The force sensitive input device may further comprise an opaque housing defining a chamber, and the reflective surface and the reflectance sensor may be disposed in the chamber. The reflectance sensor may comprise a light-emitting diode (LED) configured to emit the light and a phototransistor configured to receive the amount of the light that is reflected from the reflective surface. The LED may be configured to emit infrared light.

In some embodiments, the resilient component may be configured to allow a displacement of the button from the first end position that is proportional to a force applied to the button by a user. The amount of the light that is reflected from the reflective surface may be monotonically related to the displacement of the button from the first end position. The amount of the light that is reflected from the reflective surface may be monotonically related to a force applied to the button by a user.

In some embodiments, the reflectance sensor may be configured to output an analog signal that is a function of the amount of the light that is reflected from the reflective surface. The force sensitive input device may further comprise an analog-to-digital converter (ADC) configured to output a digital signal based upon the analog signal. The force sensitive input device may further comprise a low-pass filter configured to reduce noise in the analog signal before the analog signal is received by the ADC.

According to another aspect, an input device may comprise a first input key configured to output a first analog signal as a function of force applied to the first input key, a second input key configured to output a second analog signal as a function of force applied to the second input key, a third input key configured to output a third analog signal as a function of force applied to the third input key, a fourth input key configured to output a fourth analog signal as a function of force applied to the fourth input key, and a controller configured to output movement data including both direction and magnitude in response to the first, second, third, and fourth analog signals. Each of the first, second, third, and fourth input keys may comprise any one of force sensitive input devices described above.

In some embodiments, the controller may comprise an analog-to-digital converter (ADC) configured to convert the first, second, third, and fourth analog signals into digital signals. The input device may further comprise a low-pass filter configured to reduce noise in at least one of the first, second, third, and fourth analog signals before the analog signal is received by the ADC of the controller.

In some embodiments, the controller may be configured to format the movement data for presentation to a driver of a computing device. The movement data may include an x-axis component and a y-axis component, the x-axis component being a function of the first and second analog signals, and the y-axis component being a function of the third and fourth analog signals. The input device may further comprise a number of binary input keys, each of the binary input keys being configured to output a digital signal indicating whether or not the binary input key has been pressed.

According to yet another aspect, a method may comprise biasing a button that is movable along a first axis between a first end position and a second end position toward the first end position using a resilient component, illuminating a reflective surface of the button with light that travels generally parallel to the first axis, measuring, while the button is displaced from the first end position toward the second end position, an amount of the light that is reflected from the reflective surface and that travels generally parallel to the first axis, and determining a force applied to the button as a function of the measured amount of the light.

In some embodiments, biasing the button toward the first end position may comprise biasing the button using a spring. Illuminating the reflective surface of the button may comprise emitting light from a light-emitting diode (LED) facing the reflective surface. Emitting light from the LED may comprise emitting infrared light. The amount of the light that is reflected from the reflective surface may be monotonically related to the force applied to the button. The method may further comprise generating movement data including both direction and magnitude in response to the determined force.

In some embodiments, measuring the amount of the light that is reflected from the reflective surface may comprise receiving light using a phototransistor. The phototransistor may output an analog signal that is a function of the amount of the light that is reflected from the reflective surface. Determining the force applied to the button may comprise converting the analog signal output by the phototransistor into a digital signal using an analog-to-digital converter (ADC). Determining the force applied to the button further may comprise reducing noise in the analog signal using a low-pass filter, prior to the analog signal being converted by the ADC.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, the same reference labels or similar reference labels (e.g., reference labels ending in the same two digits) have been repeated among the figures to indicate corresponding or analogous elements. The detailed description particularly refers to the accompanying figures in which.

DETAILED DESCRIPTION OF THE DRAWINGS

Figure 1:
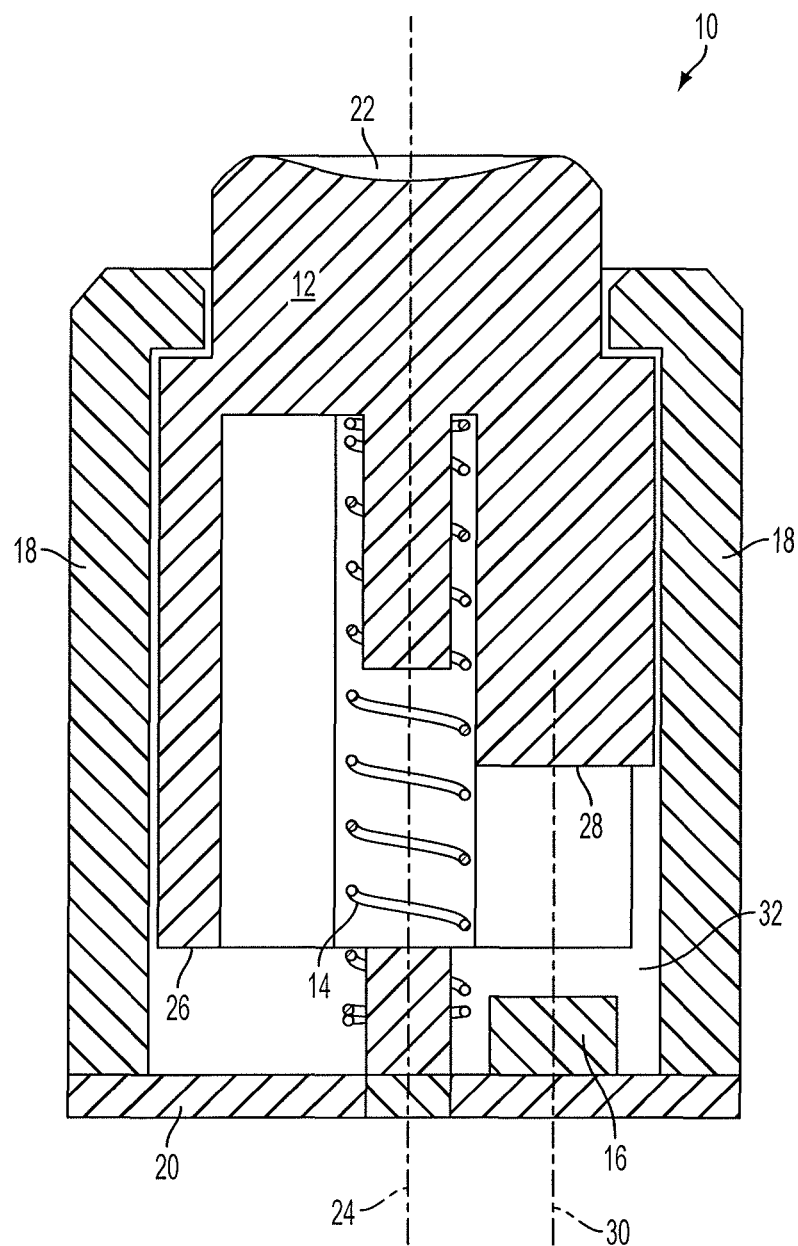
FIG. 1 is a cross-sectional view of one illustrative embodiment of a force sensitive input device.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but, on the contrary, the intention is to cover all modifications, equivalents, and alternatives falling within the spirit and scope of the invention as defined by the appended claims.

In the following description, numerous specific details, such as types and interrelationships of circuit components, are set forth in order to provide a more thorough understanding of the present disclosure. It will be appreciated, however, by one skilled in the art that embodiments of the disclosure may be practiced without such specific details. In other instances, various circuit components have not been shown in detail (or not labeled in every instance) in order to not obscure the invention. Those of ordinary skill in the art, with the included descriptions, will be able to implement appropriate functionality without undue experimentation.

References in the specification to "one embodiment," "an embodiment," "an illustrative embodiment," etcetera, indicate that at least one embodiment described may include a particular feature, structure, or characteristic, but not every embodiment necessarily includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Referring now to FIG. 1, one illustrative embodiment of a force sensitive input device 10 is shown in cross-section. In this illustrative embodiment, the input device 10 generally includes a button 12, a resilient component 14, a reflectance sensor 16, and a housing 18. In some embodiments, such as that shown in FIG. 1, a bottom side of the housing 18 may be open, allowing the input device 10 to be secured to a support surface, such as a printed circuit board (PCB) 20. It is contemplated that, in other embodiments, the input device 10 may contain additional or different components to those illustrated in FIG. 1.

The button 12 of the input device 10 includes a surface 22 that is exposed through the housing 18 and is designed to be pressed by a user. The button 12 is movable relative to the housing 18 along an axis 24 between two end positions. The button 12 is illustrated in FIG. 1 in a top end position. When the surface 22 of the button is pressed by a user, the button 12 may move along the axis 24 (downward in FIG. 1) until the button 12 reaches a bottom end position. In the illustrative embodiment, a bottom surface 26 of the button 12 will be proximate to the PCB 20 when the button 12 is in the bottom end position. As the button 12 is an analog mechanism, the button 12 is positionable at an infinite number of positions between the top and bottom end positions.

The button 12 includes a reflective surface 28 that partially or fully reflects some or all types of light. By way of example, the reflective surface 28 may reflect light of a particular wavelength or spectrum of wavelengths. In the illustrative embodiment, the reflective surface 28 is a surface of the button 12 (i.e., the reflective surface 28 is integrally formed with the button 12). In other embodiments, the reflective surface 28 may be coupled to the button 12 after the button 12 has been formed. By way of example, the reflective surface 28 may be applied to a surface of the button 12 as a reflective coating.

The resilient component 14 of the input device 10 biases the button 12 toward the top end position. As shown in FIG. 1, the resilient component 14 is illustratively embodied as a metal coil spring 14. One end of the spring 14 is engaged with the button 12, while the other end of the spring 14 is engaged with the PCB 20. In the illustrative embodiment of FIG. 1, the spring 14 has a generally cylindrical shape, and the button 12 and the PCB 20 each include a cylindrical feature that is received within one end of the spring 14 to maintain engagement with the spring 14. The resilient nature of the spring 14 allows the button 12 to move along the axis 24 when a force is applied to the button 12 by a user, but causes the button 12 to return to the top end position, shown in FIG. 1, when the force is no longer applied by the user. This configuration of the button 12 and the spring 14 provides haptic feedback that allows a user to feel the amount of input (i.e., force) that the user is applying to the button 12. Furthermore, the spring 14 may be designed with a fast, robust response that requires very little relaxation time. It will be appreciated that, in other embodiments, the resilient component 14 may be any type of component that allows movement of the button 12 along the axis 24, but biases the button 12 toward the top end position (e.g., a rubber dome).

The reflectance sensor 16 of the input device 10 is configured to emit light that impinges upon the reflective surface 28. An amount of the light that impinges upon the reflective surface 28 will be reflected back toward the reflectance sensor 16 and will be measured by the reflectance sensor 16. As shown in FIG. 1, the light emitted from the reflectance sensor 16 that is reflected by the reflective surface 28 and then returns to the reflectance sensor 16 generally travels along an axis 30 that is parallel to the axis 24. In the illustrative embodiment, the reflective surface 28 is generally perpendicular to the axis 30. As the button 12 moves along the axis 24 (e.g., when a force is applied to the button 12 by a user), the reflective surface 28 of the button 12 will move along the axis 30.

As the distance between the reflectance sensor 16 and the reflective surface 28 of the button 12 changes, the amount of light that is reflected from the reflective surface 28 back to the reflectance sensor 16 will also change (for instance, when the reflective surface 28 and the reflectance sensor 16 are farther apart, more scattering will occur and less light will return to the reflectance sensor 16). In particular, the amount of light that is reflected from the reflective surface 28 is monotonically related to the displacement of the button 12 from the top end position (i.e., the distance the button 12 travels along the axis 24, which is also the distance the reflective surface 28 travels along the axis 30). As such, by measuring the amount of light that is reflected from the reflective surface 28, the reflectance sensor 16 is able to indirectly measure the distance between the reflectance sensor 16 and the reflective surface 28 of the button 12.

The measurement by the reflectance sensor 16 of the amount of light that is reflected from the reflective surface 28 is related not only to the distance between the reflectance sensor 16 and the reflective surface 28 but also, as a result of the spring 14, to the force applied to the button 12 by a user. The particular properties of the spring 14 (or other resilient component 14) used in the input device 10 will result in a particular relationship between the amount of force applied to the button 12 and the displacement of the button 12 allowed by the spring 14. In the illustrative embodiment, the spring 14 is configured to allow a displacement of the button 12 from the top end position that is proportional to the force applied to the button 12. As the displacement of the button 12 is proportional to the force applied, and the amount of light reflected from the reflective surface 28 is monotonically related to the displacement of the button 12, the amount of the light that is reflected from the reflective surface 28 is also monotonically related to the force applied to the button 12. As such, by measuring the amount of light that is reflected from the reflective surface 28, the reflectance sensor 16 is also able to indirectly measure a force applied to the button 12 by a user.

In the illustrative embodiment, the reflectance sensor 16 includes a light-emitting diode (LED) configured to emit the light and a phototransistor configured to receive and measure the amount of the light that is reflected from the reflective surface 28. In particular, the reflectance sensor 16 is illustratively embodied as a QRE1113 Minature Reflective Object Sensor, commercially available from Fairchild Semiconductor Corporation of San Jose, Calif. As shown in FIG. 1, the reflectance sensor 16 may be soldered to the PCB 20 with the LED and the phototransistor facing the reflective surface 28. When energized, the LED of the reflectance sensor 16 emits infrared light toward the reflective surface 28. Infrared light returning from the reflective surface 28 to the reflectance sensor 16 impinges upon the phototransistor. In the illustrative embodiment, the phototransistor of the reflectance sensor 16 is a bipolar junction transistor (BJT) with a light sensitive base. As such, the phototransistor will output an analog signal (e.g., of varying voltage) that is a function of the amount of the light that is reflected from the reflective surface 28 back to the reflectance sensor 16. This analog signal may be processed to determine a force applied to the button 12, as further described below. It is contemplated that, in other embodiments, the reflectance sensor 16 may have other configurations that include different light sources and/or light sensors.

The housing 18 may have any suitable shape for supporting the components of the input device 10. In the illustrative embodiment, the housing 18 defines a chamber 32 in an interior portion of the housing 18. As shown in FIG. 1, the reflectance sensor 16 is disposed in the chamber 32. A portion of the button 12 is also disposed in the chamber 32. In particular, the reflective surface 28 of the button 12 is disposed in the chamber 32. In the illustrative embodiment, the housing 18 is formed of an opaque material, such that the light emitted by the reflectance sensor 16 does not pass through the housing 18. The opaque housing 18 also prevents outside light from impinging upon and being measured by the reflectance sensor 16.

Figure 2:
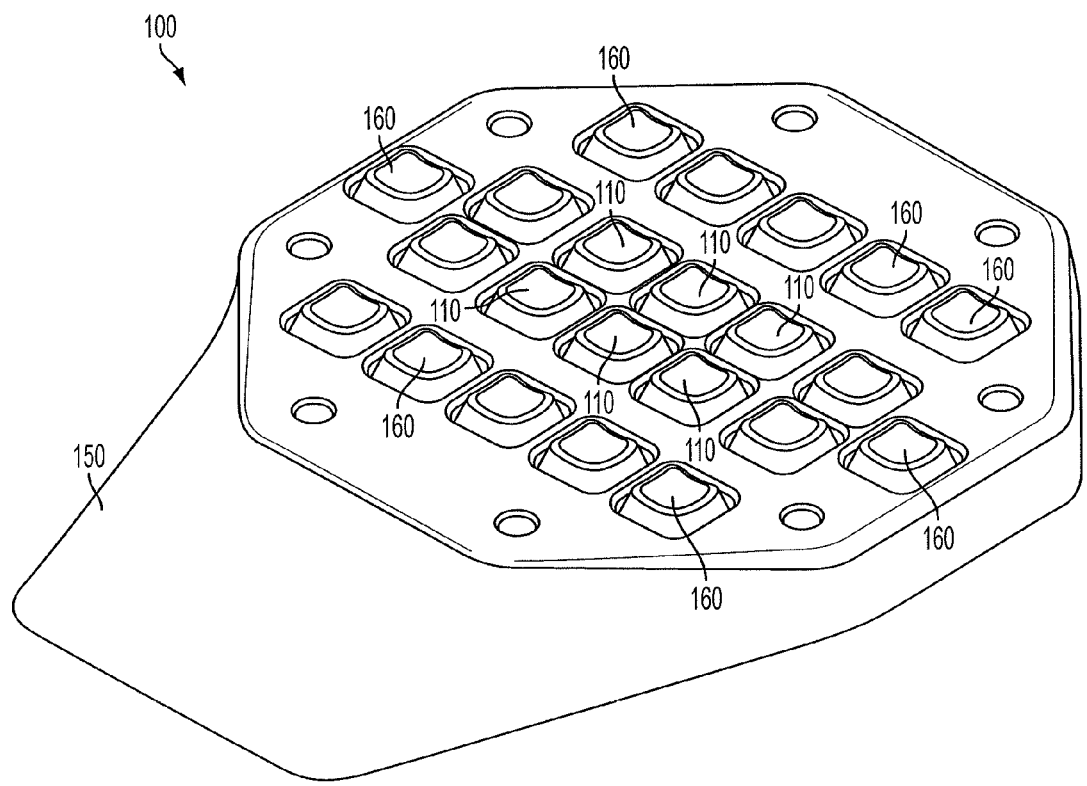
FIG. 2 is a perspective view of one illustrative embodiment of an input device including a number of force sensitive input keys and a number of binary input keys.
Figure 3:
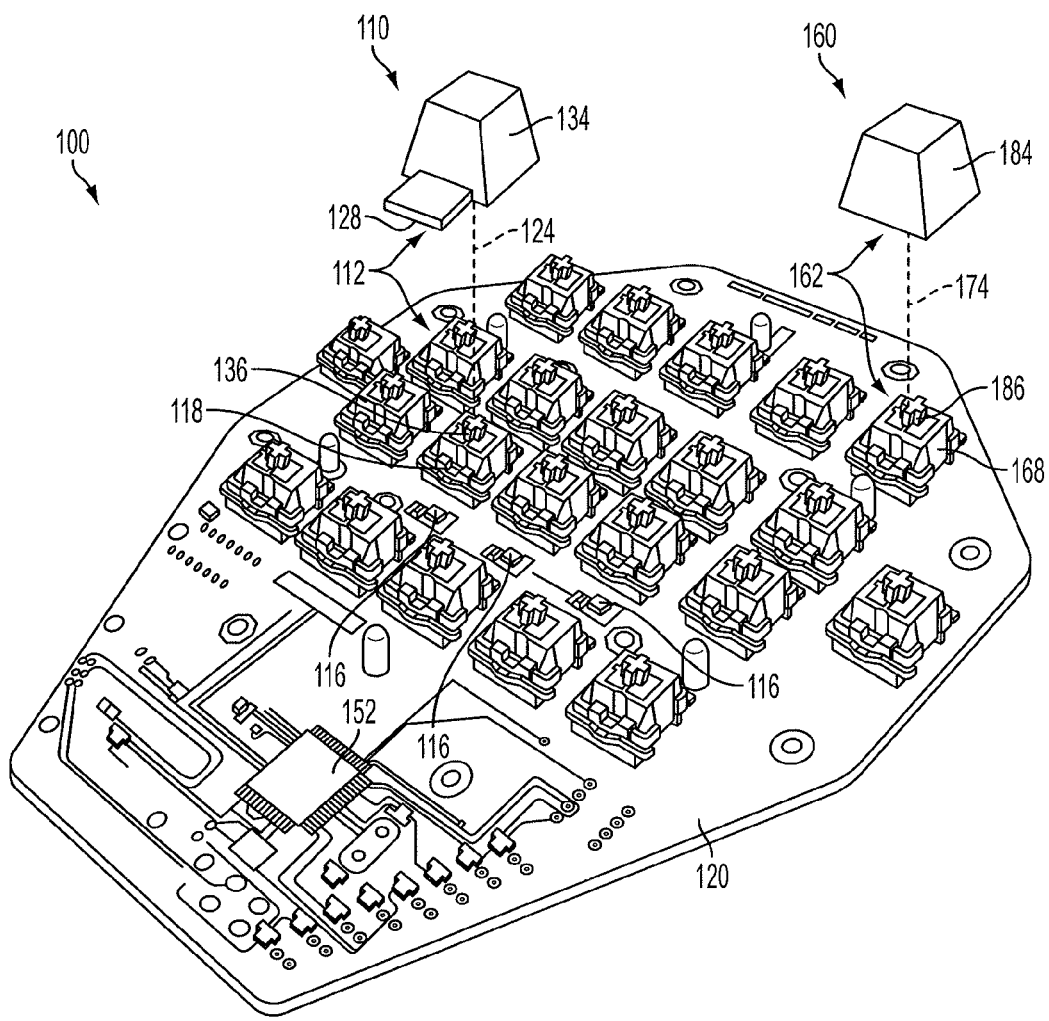
FIG. 3 is a partially-exploded perspective view of several components of the input device of FIG. 2.

Referring now to FIGS. 2 and 3, one illustrative embodiment of an input device 100 is shown as a gaming controller, or game pad, 100. While the present disclosure generally describes applications involving electronic games (e.g., computer games), it will be appreciated that one or more features of the input device 100 may advantageously be incorporated into input devices for many applications in the fields of consumer, industrial, medical, and other electronics. It is contemplated that input devices similar to those described herein may be useful in translating user intent to a form interpretable by any type of computing device, including, but not limited to, personal computers, entertainment systems, industrial computing systems, stenography devices, medical computing systems, and other computing devices. By way of example, when an input device according to the present disclosure is used in a medical application (specifically, radiology), the force applied by a user to a force sensitive input key of the input device may control how fast a computerized tomography system changes between the displayed slices.

As shown in FIG. 2, the game pad 100 includes a number of force sensitive input keys 110 and a number of binary input keys 160. In particular, the illustrative embodiment of the game pad 100 includes six force sensitive input keys 110 that are arranged near the center of the game pad 100 and sixteen binary input keys 160 that surround the force sensitive input keys 110 (not all binary input keys 160 are labeled in FIG. 2). It is contemplated that, in other embodiments, the game pad 100 may include any number of force sensitive input keys 110 and any number of binary input keys 160 (including no binary input keys 160). As described below, an arrangement of at least four force sensitive input keys 110 may be advantageous for certain applications. The game pad 100 also includes a cover 150 to protect the internal electronic components of the game pad 100. The game pad 100 is shown in FIG. 3 with the cover 150 removed to expose several internal components of the game pad 100. It is contemplated that, in other embodiments, the game pad 100 may contain additional or different components to those illustrated in FIGS. 2 and 3.

Except as noted below, each of the force sensitive input keys 110 of the game pad 100 has a similar configuration and operation to the force sensitive input device 10 described above (with reference to FIG. 1). In the illustrative embodiment shown in FIGS. 2 and 3, the force sensitive input keys 110 (and the binary input keys 160) of the game pad 100 are each embodied in the form factor of a standard keyswitch. In particular, the button 112 of each force sensitive input key 110 has a two-part construction that includes a keycap 134 configured to be pressed by a user and a plunger 136 that engages a spring 114 within a housing 118. The housing 118, plunger 136, and spring 114 of each force sensitive input key 110 are illustratively embodied as an MX Series Desktop Profile 0.60 Inch Keyswitch (with linear actuation), commercially available from Cherry Corporation of Pleasant Prairie, Wis. The button 162 of each binary input key 160 has a similar two-part construction that includes a key cap 184 and a plunger 186 that engages a spring 164 within a housing 168. The housing 168, plunger 186, and spring 164 of each binary input key 160 are illustratively embodied as an MX Series Desktop Profile 0.60 Inch Keyswitch (with pressure point click), also commercially available from Cherry Corporation. The housing 118 of each force sensitive input key 110 and the housing 168 of each binary input key 160 are secured to a PCB 120.

The majority of the keycaps 134, 184 have been removed in FIG. 3 to expose the housings 118, 168 and the plungers 136, 186 of the input keys 110, 160. One keycap 134 and one keycap 184 are shown in the partially-exploded view of FIG. 3 to indicate their relationships to the plunger 136 and the plunger 186, respectively. When the keycap 134 is coupled to the plunger 136, the plunger 136 supports the keycap 134. When assembled, the keycap 134 and plunger 136 move together along an axis 124 as the button 112 of the force sensitive input key 110. Similarly, when the keycap 184 is coupled to the plunger 186, the plunger 186 supports the keycap 184. When assembled, the keycap 184 and plunger 186 move together along an axis 174 as the button 162 of the binary input key 160.

As shown in FIG. 3, for each of the force sensitive input keys 110, the reflectance sensor 116 is positioned outside the housing 118 (rather than within the housing, like the illustrative embodiment of the force sensitive input device 10 shown in FIG. 1). In particular, the reflectance sensor 116 of each of the force sensitive input keys 110 is soldered to the PCB 120 in a position adjacent the housing 118. In the illustrative embodiment, the keycap 134 of each of the force sensitive input keys 110 includes a reflective surface 128. As shown in FIG. 3, the reflective surface 128 extends outwardly from the keycap 134 above the reflectance sensor 116. In the illustrative embodiment, the reflective surface 128 is integrally formed with the keycap 134 (i.e., the reflective surface 128 is a surface of the keycap 134). In other embodiments, the reflective surface 128 may be coupled to the keycap 134 after the keycap 134 has been formed. As the button 112 (including the keycap 134) moves along the axis 124, the reflective surface 128 will move along an axis that is generally parallel to the axis 124. In the illustrative embodiment, the reflective surface 128 is generally perpendicular to the axis 124 (and the axis of its travel).

Like the force sensitive input device 10 described above, each of the force sensitive input keys 110 of the game pad 100 is configured to output an analog signal that is a function of the force applied to that input key 110. In particular, the reflectance sensor 116 of each force sensitive input key 110 will generate an analog signal in response to the amount of reflected light measured. As described above, since the displacement of the button 112 (including the keycap 134 and its reflective surface 128) is proportional to the force applied to the keycap 134 and the amount of light reflected from the reflective surface 128 is monotonically related to the displacement of the button 112, the amount of the light that is reflected from the reflective surface 128 is also monotonically related to the force applied to the keycap 134. As such, by measuring the amount of light that is reflected from the reflective surface 128, the reflectance sensor 116 is also able to indirectly measure the force applied by a user.

The analog signal output by each of the force sensitive input keys 110 of the game pad 100 is transmitted to a controller 152 that determines a force applied to each of the force sensitive input keys 110 based on the respective analog signal. In the illustrative embodiment, the controller 152 of the game pad 100 is soldered to the PCB 120. In other embodiments, the controller 152 may be external to the game pad 100. The controller 152 is illustratively embodied as an ATmega16 U4 8-Bit AVR Microcontroller with 16K Bytes of ISP Flash and USB Controller, commercially available from Atmel Corporation of San Jose, Calif. The controller 152 includes an analog-to-digital converter (ADC) configured to convert the analog signals received from the force sensitive input keys 110 into digital signals. In other words, the ADC of the controller 152 is configured to output a digital signal based upon each analog signal received from the force sensitive input keys 110. It is contemplated that, in other embodiments, the ADC may be separate from the controller 152 (i.e., a separate component soldered to the PCB 120). In the illustrative embodiment, the game pad 100 also includes one or more low-pass filters soldered to a backside of the PCB 120 (not shown). These one or more low-pass filters are positioned between the force sensitive input keys 110 and the ADC of the controller 152 and are configured to reduce noise in one or more of the analog signals from the force sensitive input keys 110 before the analog signals are received by the ADC.

Once the analog signals from the force sensitive input keys 110 have been converted into digital signals, the controller 152 of the game pad 100 may determine a force applied to each of the force sensitive input keys 110. As described above, the magnitude of each analog signal represents the amount of the light measured by each force sensitive input key 110, which is monotonically related to the force applied to the keycap 134 of that input key 110. As such, the controller 152 may calculate the force applied to one of the force sensitive input keys 110 using the value of the received analog signal (converted to a digital signal). The controller 152 may perform this calculation of the force applied using a mathematical function, a look-up table, or any other suitable calculation process. The controller 152 may then perform appropriate calibration, mapping, and/or scaling of the determined force into a format suitable for presentation to a driver of a computing device connected to the game pad 100.

In the illustrative embodiment, the controller 152 is configured to output movement data including both direction and magnitude in response to analog signals received from four of the force sensitive input keys 110 of the game pad 100. In particular, two of the force sensitive input keys 110 may be used to register user intent regarding movement along an x-axis (one input key 110 representing positive movement along the x-axis and one input key 110 representing negative movement along the x-axis). Likewise, two of the force sensitive input keys 110 may be used to register user intent regarding movement along a y-axis (one input key 110 representing positive movement along the y-axis and one input key 110 representing negative movement along the y-axis). Using the analog signals output by these four force sensitive input keys 110, the controller 152 may generate movement data that includes an x-axis component and a y-axis component. When any one of the four force sensitive input keys 110 is pressed by a user, the controller 152 may calculate a vector in the corresponding direction, where a magnitude of the vector is proportional to the force applied to that input key 110 by the user. Where multiple (e.g., two) force sensitive input keys 110 are pressed simultaneously, the controller 152 may add the calculated vectors to determine the overall direction and magnitude of movement intended by the user. In an electronic gaming application (e.g., a computer game), this movement data may be used to accurately and precisely control the movement and/or actions of a character in the game.

As mentioned above, the controller 152 may format the determined movement data for presentation to a driver of a computing device connected to the game pad 100. For instance, the movement data may be formatted according to a Universal Serial Bus (USB) protocol (e.g., by a USB controller included in the controller 152) where the game pad 100 is coupled to the computing device via a USB cable. In other embodiments, the controller 152 may format the movement data according to the Direct Input protocol, the X-Input protocol, or any other protocol expected by a driver of a particular computing device. In some embodiments, the formatting performed by the controller 152 may be adjustable by a user. For instance, the user may set how different forces applied to one of the force sensitive input keys 110 of the game pad 100 are mapped to a 256-value scale. This configurability may allow more users (e.g., of different abilities) to effectively use the game pad 100. In some embodiments, the user may also be able to instruct the game pad 100 to interpret the analog signal(s) from one or more of the force sensitive input keys 110 like a binary input key 160 (i.e., treat any force exceeding an adjustable threshold as a binary "on" and treat all other forces applied as a binary "off"). In the illustrative embodiment, the binary input keys 160 of the game pad 100 are configured to output a digital signal that indicates whether or not the binary input key has been pressed.

Figure 4:
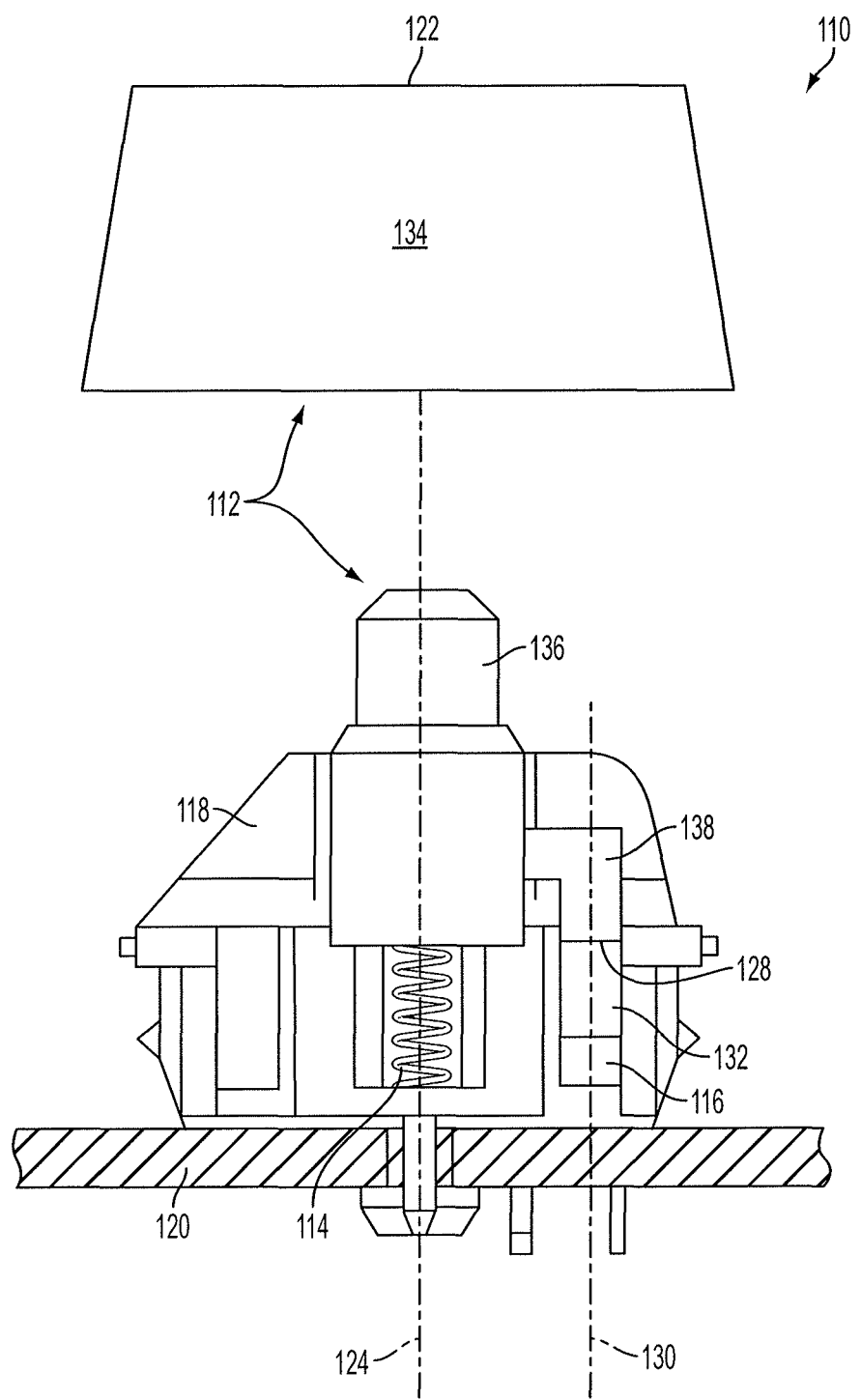
FIG. 4 is a cross-sectional view of another illustrative embodiment of a force sensitive input key that may be used in the input device of FIG. 2.

Referring now to FIG. 4, another illustrative embodiment of a force sensitive input key 110 that may be used in the game pad 100 (or other input devices 100) is shown in cross-section. The illustrative embodiment of the force sensitive input key 110 shown in FIG. 4 is similar in configuration and operation to the force sensitive input keys 110 shown in FIGS. 2 and 3, except that (like the force sensitive input device 10 of FIG. 1) the reflectance sensor 116 is disposed in a chamber 132 defined within the housing 118. As shown in FIG. 4, the button 112 of the force sensitive input key 110 has a two part construction that includes a keycap 134 (with a surface 122 configured to be pressed by a user) and a plunger 136 that engages a spring 114 within the housing 118. The plunger 136 is movable along an axis 124 when a force is applied to the keycap 134 by a user. The plunger 136 is illustrated in FIG. 4 in a top end position. When the surface 122 of the keycap 134 is pressed by a user, the keycap 134 and the plunger 136 may both move along the axis 124 (downward in FIG. 4) until the button 112 reaches a bottom end position.

In the illustrative embodiment of FIG. 4, the plunger 136 includes a plunger arm 138 that extends into the chamber 132 defined in the housing 118. The reflective surface 128 of the button 112 is included on the plunger arm 138 and faces the reflectance sensor 116. In the illustrative embodiment, the reflective surface 128 is integrally formed with the plunger 136 (i.e., the reflective surface 128 is a surface of the plunger 136). In other embodiments, the plunger arm 138 and/or the reflective surface 128 may be coupled to the plunger 136 after the plunger 136 has been formed. As the button 112 (including the plunger 136) moves along the axis 124, the reflective surface 128 will move along an axis 130 that is generally parallel to the axis 124. In the illustrative embodiment, the reflective surface 128 is generally perpendicular to the axis 130 (as well as the axis 124). In the illustrative embodiment, the housing 118 may be formed of an opaque material, such that light is not able to escape and/or enter the chamber 132.

Figure 5:
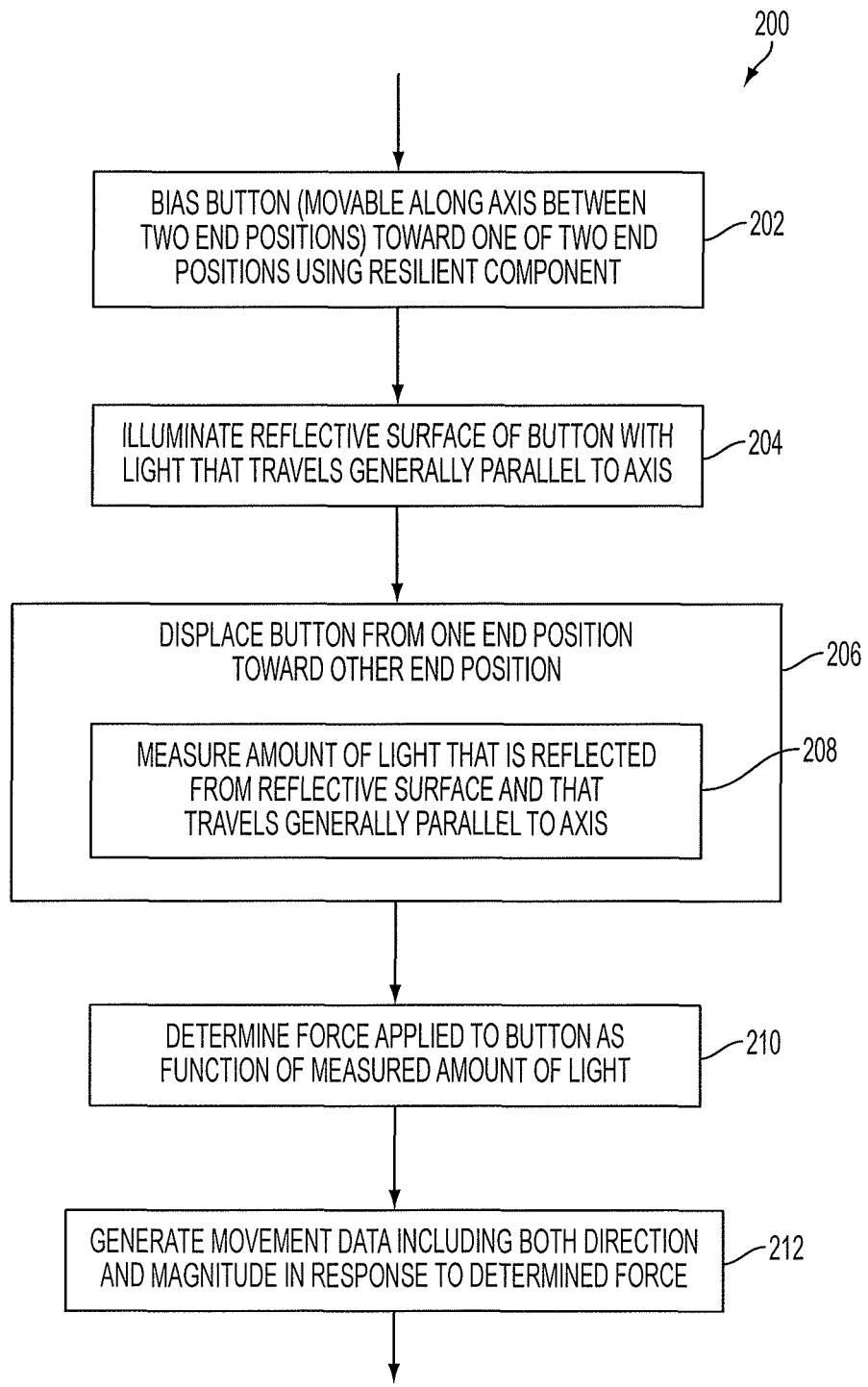
FIG. 5 is a simplified flow diagram showing one illustrative embodiment of a force sensitive input method.

Referring now to FIG. 5, one illustrative embodiment of a force sensitive input method 200 is shown as a simplified flow diagram. The method 200 may be used with the force sensitive input device 10 of FIG. 1, with the force sensitive input keys 110 of FIGS. 2-4, and/or with any other suitable force sensitive input device(s). The method 200 begins with block 202 in which a button 12 that is movable along an axis 24 between two end positions is biased toward one of the two end positions using a resilient component 14. As described above, the button 12 may be biased toward one of the two end positions using a spring 14. While the spring 14 allows displacement of the button 12 along the axis 24 (as described below), the spring 14 continually biases the button 12 toward one of the two end positions (i.e., the block 202 is performed throughout the method 200).

The method 200 continues with block 204 in which a reflective surface 28 of the button 12 is illuminated with light that travels generally parallel to the axis 24. In some embodiments, block 204 may involve illuminating the reflective surface 28 of the button 12 by emitting light from an LED of a reflectance sensor 16 that faces the reflective surface 28. In particular, block 204 may involve emitting infrared light from the LED of the reflectance sensor 16. It is contemplated that, in other embodiments, other types of light sources and/or other types of light may be used to illuminate the reflective surface 28 of the button 12. The block 204 may be performed either continuously or intermittently throughout the method 200.

After block 204, the method 200 continues to block 206 in which the button 12 is displaced from one end position (specifically, the end position toward which it is biased in block 202) toward the other end position. In some embodiments, block 204 may involve a user applying a force to the button 12 to cause movement of the button 12 along the axis 24. During block 206, the method 200 also involves block 208 in which an amount of the light that is reflected from the reflective surface 28 and that travels generally parallel to the axis 24 is measured by the reflectance sensor 16. In some embodiments, block 204 may involve receiving and measuring the reflected light using a phototransistor of the reflectance sensor 16. During block 208, the phototransistor of the reflectance sensor 16 may output an analog signal that is a function of the amount of the light that is reflected from the reflective surface 28. As described above, the amount of the light that is reflected from the reflective surface 28 (and, hence, the magnitude(s) of the generated analog signal) may be monotonically related to the force applied to the button 12 in block 206.

After blocks 206 and 208, the method 200 continues to block 210 in which the force applied to the button 12 in block 206 is determined as a function of the amount of light measured in block 208. In some embodiments, block 210 may involve a controller 152 receiving the analog signal output by the phototransistor in block 208 and calculating the force applied to the button 12 using this analog signal, as described above. In such embodiments, block 210 may involve converting the analog signal output by the phototransistor into a digital signal using an ADC of the controller 152. In some embodiments, block 210 may also involve reducing noise in the analog signal using a low-pass filter, prior to the analog signal being converted by the ADC.

After block 210, the method 200 may continue to block 212 in which the controller 152 generates movement data in response to the force determined in block 210. As described above, where the method 200 is used with one or more force sensitive input devices 10 and/or force sensitive input keys 110, the movement data generated by the controller 152 may include both direction and magnitude of movement. In some embodiments, block 212 may involve formatting the movement data for presentation to a driver of a computing device and transmitting the formatted data to the computing device.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. An input device comprising:
   a first input key configured to output a first analog signal as a function of force applied to the first input key;
   a second input key configured to output a second analog signal as a function of force applied to the second input key;
   a third input key configured to output a third analog signal as a function of force applied to the third input key;
   a fourth input key configured to output a fourth analog signal as a function of force applied to the fourth input key; and
   a controller configured to output movement data including both direction and magnitude in response to the first, second, third, and fourth analog signals;
   wherein the first, second, third, and fourth input keys each comprise:
   a button movable along a respective axis between a first end position and a second end position, the button including a reflective surface;
   a resilient component biasing the button toward the first end position; and
   a reflectance sensor configured to emit light that impinges upon the reflective surface, to measure an amount of the light that is reflected from the reflective surface, and to output the respective analog signal in response to the measured amount of the reflected light, wherein the light travels generally parallel to the respective axis.

2. The input device of claim 1, wherein the controller comprises an analog-to-digital converter (ADC) configured to convert the first, second, third, and fourth analog signals into digital signals.

3. The input device of claim 2, further comprising a low-pass filter configured to reduce noise in at least one of the first, second, third, and fourth analog signals before the analog signal is received by the ADC of the controller.

4. The input device of claim 1, wherein the controller is configured to format the movement data for presentation to a driver of a computing device.

5. The input device of claim 1, wherein the movement data includes an x-axis component and a y-axis component, the x-axis component being a function of the first and second analog signals, and the y-axis component being a function of the third and fourth analog signals.

6. The input device of claim 1, further comprising a number of binary input keys, each of the binary input keys being configured to output a digital signal indicating whether or not the binary input key has been pressed.

7. The input device of claim 1, wherein the button of each of the first, second, third, and fourth input keys comprises:
   a keycap configured to be pressed by a user to move the button along the first axis toward the second end position; and
   a plunger supporting the keycap, the plunger engaging the resilient component.

8. The input device of claim 1, wherein each of the first, second, third, and fourth input keys further comprises an opaque housing defining a respective chamber, the reflective surface and the reflectance sensor being disposed in the respective chamber.

9. The input device of claim 1, wherein the reflectance sensor of each of the first, second, third, and fourth input keys comprises:

a light-emitting diode (LED) configured to emit the light; and a phototransistor configured to receive the amount of the light that is reflected from the reflective surface.

10. The input device of claim 1, wherein the resilient component of each of the first, second, third, and fourth input keys is configured to allow a displacement of the button from the first end position that is proportional to a force applied to the button by a user.

11. The force sensitive input device of claim 10, wherein, for each of the first, second, third, and fourth input keys, the amount of the light that is reflected from the reflective surface is monotonically related to the displacement of the button from the first end position.

12. A method comprising:
biasing a button that is movable along a first axis between a first end position and a second end position toward the first end position using a resilient component such that a force being applied to the button results in a displacement of the button from the first end position toward the second end position that is proportional to a magnitude of the force;
illuminating a reflective surface of the button with light that travels generally parallel to the first axis;
measuring, while the button is displaced from the first end position toward the second end position, an amount of the light that is reflected from the reflective surface and that travels generally parallel to the first axis;
determining the force applied to the button as a function of the measured amount of the light; and
outputting a value indicative of the magnitude of the force applied to the button.

13. The method of claim 12, wherein illuminating the reflective surface of the button comprises emitting light from a light-emitting diode (LED) facing the reflective surface.

14. The method of claim 12, wherein measuring the amount of the light that is reflected from the reflective surface comprises receiving light using a phototransistor.

15. The method of claim 14, wherein the phototransistor outputs an analog signal that is a function of the amount of the light that is reflected from the reflective surface.

16. The method of claim 12, wherein the amount of the light that is reflected from the reflective surface is monotonically related to the force applied to the button.

17. The method of claim 12, further comprising generating movement data including both direction and magnitude in response to the determined force.

18. The method of claim 12, wherein outputting the value indicative of the magnitude of the force applied to the button comprises further comprising mapping the determined force to a scale expected by a driver of a computing device.

19. The method of claim 15, further comprising converting the analog signal into a digital signal that represents the amount of the light that is reflected from the reflective surface.

20. The method of claim 19, wherein determining the force applied to the button comprises calculating the force using a mathematical function that takes a value of the digital signal as an input.

21. The method of claim 19, wherein determining the force applied to the button comprises consulting a look-up table that relates a value of the digital signal to a force value.

22. The input device of claim 8, wherein, for each of the first, second, third, and fourth input keys, when the button is in the second end position, the button contacts the opaque housing to block further movement of the button along the respective axis away from the first end position.

23. The input device of claim 7, wherein, for each of the first, second, third, and fourth input keys, the reflective surface of the button is spaced apart from a portion of the plunger that engages the resilient component.

24. The input device of claim 23, wherein, for each of the first, second, third, and fourth input keys, the portion of the plunger that engages the resilient component is configured to move along the respective axis and the reflective surface is configured to move along a parallel axis.

25. The input device of claim 24, wherein, for each of the first, second, third, and fourth input keys, the reflective surface is perpendicular to the parallel axis.

26. The input device of claim 1, wherein the controller is configured to:
calculate a first vector having a first magnitude based on a value of the first analog signal;
calculate a second vector having a second magnitude based on a value of the second analog signal;
calculate a third vector having a third magnitude based on a value of the third analog signal; and
calculate a fourth vector having a fourth magnitude based on a value of the fourth analog signal;
wherein the direction and the magnitude of the movement data represent a vector addition of the first, second, third, and fourth vectors.

27. The input device of claim 4, wherein the controller is configured to format the movement data to a scale expected by the driver of the computing device.

28. The input device of claim 4, wherein the controller is configured to format the movement data according to either the DirectInput protocol or the XInput protocol.

29. The input device of claim 5, wherein:
the x-axis component represents a first distance from a resting point, the first distance being proportional to a force applied to one of the first and second input keys; and
the y-axis component represents a second distance from the resting point, the second distance being proportional to a force applied to one of the third and fourth input keys.

\* \* \* \* \*